US012701836B2

(12) United States Patent
Lin et al.

(10) Patent No.: US 12,701,836 B2
(45) Date of Patent: Aug. 4, 2026

(54) DISPLAY DEVICE

(71) Applicant: AUO Corporation, Hsin-Chu (TW)

(72) Inventors: Tzu-Chieh Lin, Hsin-Chu (TW);
Chun-Liang Lin, Hsin-Chu (TW)

(73) Assignee: AUO CORPORATION, Hsin-Chu
(TW)

( * ) Notice: Subject to any disclaimer, the term of this
patent is extended or adjusted under 35
U.S.C. 154(b) by 359 days.

(21) Appl. No.: 18/544,738

(22) Filed: Dec. 19, 2023

(65) Prior Publication Data

US 2024/0413278 A1      Dec. 12, 2024

(30) Foreign Application Priority Data

Jun. 8, 2023     (TW) .................................. 112121467

(51) Int. Cl.
H10H 20/855          (2025.01)
H10H 20/851          (2025.01)
H10W 90/00          (2026.01)

(52) U.S. Cl.
CPC ...... H10H 20/855 (2025.01); H10H 20/8515
(2025.01); H10W 90/00 (2026.01)

(58) Field of Classification Search
CPC .. H10W 90/00; H10H 20/8515; H10H 20/855
See application file for complete search history.

(56) References Cited

U.S. PATENT DOCUMENTS

| | | | | |
|---|---|---|---|---|
| 2004/0233359 | A1* | 11/2004 | Nam | ................. G02F 1/133371 |
| | | | | 349/114 |
| 2010/0243868 | A1* | 9/2010 | Liu | ........................ H10F 39/199 |
| | | | | 156/280 |
| 2019/0165318 | A1* | 5/2019 | Choi | ...................... H10K 59/38 |
| 2021/0341653 | A1 | 11/2021 | Wang et al. | |

FOREIGN PATENT DOCUMENTS

| | | |
|---|---|---|
| CN | 112213879 A | 1/2021 |
| CN | 115117220 A | 9/2022 |
| WO | 2020258768 A1 | 12/2020 |

* cited by examiner

*Primary Examiner* — Vongsavanh Sengdara
(74) *Attorney, Agent, or Firm* — McClure, Qualey &
Rodack, LLP

(57) ABSTRACT

A display device includes a light-emitting substrate, a coun-
ter substrate, multiple color conversion layers and, a pat-
terned distributed Bragg reflector. The counter substrate is
disposed opposite to the light-emitting substrate, and has
multiple sub-pixel regions. Each of the sub-pixel regions has
a sub-pixel width. The color conversion layers are disposed
between the light-emitting substrate and the counter sub-
strate. The patterned distributed Bragg reflector is disposed
on one side of the color conversion layers, and has multiple
openings. Each of the openings has an opening width greater
than or equal to 1 μm and less than the sub-pixel width.

8 Claims, 7 Drawing Sheets

DISPLAY DEVICE

CROSS-REFERENCE TO RELATED APPLICATION

This application claims priority to Taiwan Application Serial Number 112121467, filed Jun. 8, 2023, which is herein incorporated by reference in its entirety.

BACKGROUND

Field of Invention

The present disclosure relates to a display device, and in particular, to a display device including a patterned distributed Bragg reflector (DBR).

Description of Related Art

A micro-light-emitting diode (micro-LED) display device has the advantages of power saving, high efficiency, high brightness, fast response time, etc. In order to achieve full-color, one current approach is to dispose a color conversion material on a micro-light-emitting diode that needs light color conversion, to convert a light color of the micro-light-emitting diode into a different light color. However, the above approach still has the problem that the light of the micro-light-emitting diode can not be fully converted into a predetermined colored light, resulting in poor light conversion efficiency and insufficient color purity of the color of the outgoing light.

SUMMARY

The disclosure provides a display device, which can improve the light conversion efficiency and the color purity of the color of the outgoing light.

The display device according to at least one embodiment of the present disclosure includes a light-emitting substrate, a counter substrate, multiple color conversion layers, and a first patterned distributed Bragg reflector. The counter substrate is disposed opposite to the light-emitting substrate, and has multiple sub-pixel area, each of the sub-pixel areas having a sub-pixel width in a first direction. The color conversion layers are disposed between the light-emitting substrate and the counter substrate. The first patterned distributed Bragg reflector is disposed on one side of the color conversion layers and has multiple first through-holes. Each of the first through-holes has a first opening width in the first direction. The first opening width is greater than or equal to 1 μm, and less than the sub-pixel width.

The display device according to at least another embodiment of the present disclosure includes a light-emitting substrate, a counter substrate, multiple color conversion layers, and a patterned distributed Bragg reflector. The counter substrate is disposed opposite to the light-emitting substrate. The color conversion layers are disposed between the light-emitting substrate and the counter substrate. The patterned distributed Bragg reflector is located between the color conversion layers and the counter substrate, and includes multiple first sub-layers and multiple second sub-layers that are stacked alternately, where the material of each of the first sub-layers includes silicon oxide, and the material of each of the second sub-layers includes silicon nitride.

DETAILED DESCRIPTION

Figure 1:
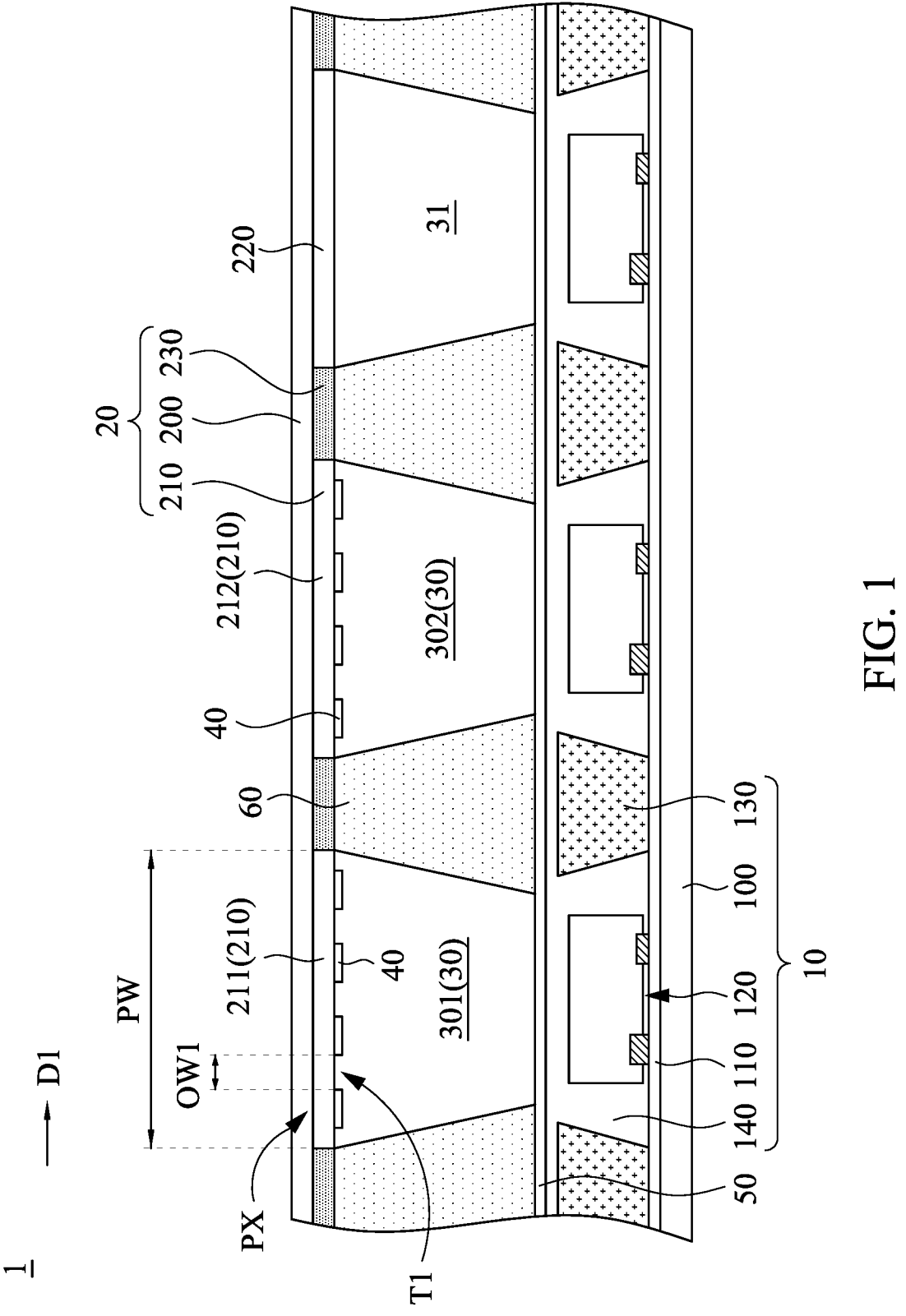
FIG. 1 is a partial cross-sectional schematic diagram of a display device according to at least one embodiment of the present disclosure.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Furthermore, the words "about", "approximately" or "substantially" used in the present disclosure not only cover the clearly stated numerical values and numerical ranges, but also cover those that can be understood by a person with ordinary knowledge in the technical field to which the present disclosure belongs. The permissible deviation range can be determined by the error generated during measurement, and the error is caused, for example, by limitations of the measurement system or process conditions. For example, two objects (such as the plane or traces of a substrate) are "substantially parallel" or "substantially perpendicular," where "substantially parallel" and "substantially perpendicular," respectively, mean that parallelism and perpendicularity between the two objects can include non-parallelism and non-perpendicularity caused by permissible deviation ranges.

In addition, "about" may mean within one or more standard deviations of the above values, such as within ±30%, ±20%, ±10%, or ±5%. Such words as "about", "approximately", or "substantially" as appearing in the present disclosure may be used to select an acceptable range of deviation or standard deviation according to optical properties, etching properties, mechanical properties, or other properties, rather than applying all of the above optical properties, etching properties, mechanical properties, and other properties with a single standard deviation.

The spatial relative terms used in the present disclosure, such as "below," "under," "above," "on," and the like, are intended to facilitate the recitation of a relative relationship between one element or feature and another as depicted in the drawings. The true meaning of these spatial relative terms includes other orientations. For example, the relationship between one element and another may change from "below" and "under" to "above" and "on" when the drawing is turned 180 degrees up or down. In addition, spatially relative descriptions used in the present disclosure should be interpreted in the same manner.

It should be understood that while the present disclosure may use terms such as "first", "second", "third" to describe various elements or features, these elements or features should not be limited by these terms. These terms are primarily used to distinguish one element from another, or one feature from another. In addition, the term "or" as used in the present disclosure may include, as appropriate, any one or a combination of the listed items in association.

Moreover, the present disclosure may be implemented or applied in various other specific embodiments, and the details of the present disclosure may be combined, modified, and altered in various embodiments based on different viewpoints and applications, without departing from the idea of the present disclosure.

FIG. 1 is a partial cross-sectional schematic diagram of a display device according to at least one embodiment of the present disclosure. Referring to FIG. 1, a display device 1 includes a light-emitting substrate 10, a counter substrate 20, multiple color conversion layers 30 and a first patterned distributed Bragg reflector 40. The light-emitting substrate 10 is used to emit a light. The counter substrate 20 is disposed opposite to the light-emitting substrate 10 and has multiple sub-pixel areas PX. Each sub-pixel area PX has a sub-pixel width PW in a first direction D1. The color conversion layers 30 are disposed between the light-emitting substrate 10 and the counter substrate 20.

The first patterned distributed Bragg reflector 40 is disposed on one side of the color conversion layers 30 and has multiple first through-holes T1. Each of the first through-holes T1 has a first opening width OW1 in the first direction D1. The first opening width OW1 is greater than or equal to 1 μm, and less than the sub-pixel width PW.

Since the light emitted by the light-emitting substrate 10 has a different color from that of the colored light converted into by the color conversion layers 30, by using the first patterned distributed Bragg reflector 40, the colored light that has been converted into by the color conversion layers 30 may be transmitted, but the leaked light that is not converted by the color conversion layers 30 may be reflected back into the color conversion layers 30 to improve the light conversion efficiency. In addition, the first through-holes T1 may increase the transmittance of the colored light that has been converted into by the color conversion layers 30. In addition, since the first opening width OW1 is greater than or equal to 1 μm, the first through-hole T1 is difficult to generate diffraction sufficient to affect the image quality, thereby maintaining or improving the image quality. Therefore, through the design of the above structures, the light conversion efficiency and the color purity of the color of the outgoing light can be improved.

As shown in FIG. 1, the first patterned distributed Bragg reflector 40 is located between the color conversion layers 30 and the counter substrate 20. In some embodiments, the first patterned distributed Bragg reflector 40 directly contacts the color conversion layers 30. In some embodiments, the color conversion layers 30 are further disposed in the first through-holes T1 of the first patterned distributed Bragg reflector 40. That is, the color conversion layers 30 are filled into the multiple first through-holes T1.

Figure 2:
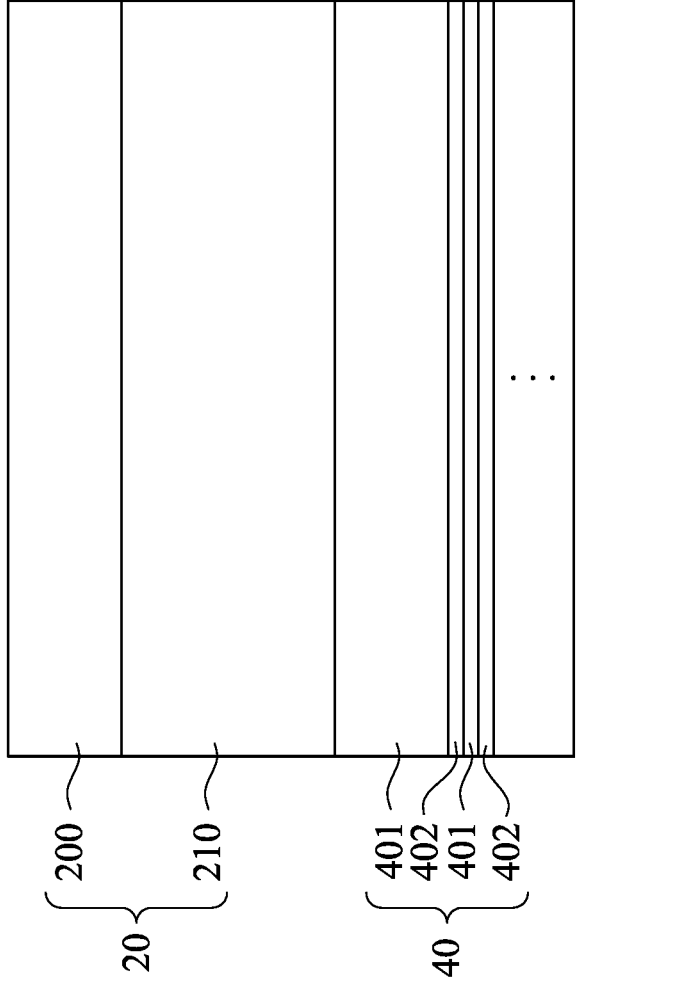
FIG. 2 is a partial cross-sectional schematic diagram of a counter substrate and a patterned distributed Bragg reflector of a display device according to at least one embodiment of the present disclosure.

FIG. 2 is a partial cross-sectional schematic diagram of a counter substrate and a patterned distributed Bragg reflector of a display device according to at least one embodiment of the present disclosure. Referring to FIG. 2, the first patterned distributed Bragg reflector 40 includes multiple first sub-layers 401 and multiple second sub-layers 402 that are stacked alternately. In some embodiments, the material of each first sub-layer 401 includes silicon oxide, and the material of each second sub-layer 402 includes silicon nitride. Through the design of the above materials and structures, the colored light that has been converted into by the color conversion layers 30 may be transmitted, but the leaked light that is not converted by the color conversion layers 30 may be reflected back into the color conversion layers 30, to improve the light conversion efficiency and the color purity of the color of the outgoing light.

In some embodiments, the refractive index of each first sub-layer 401 is different from the refractive index of each second sub-layer 402. In some embodiments, the first patterned distributed Bragg reflector 40 may be formed by stacking first sub-layers 401 with a high refractive index and second sub-layers 402 with a low refractive index, or may be formed by stacking first sub-layers 401 with a low refractive index and second sub-layers 402 with a high refractive index. In some embodiments, the material of each first sub-layer 401 and each second sub-layer 402 may also include titanium oxide, aluminum oxide, tantalum oxide, hafnium oxide or other suitable materials, or a combination of the above materials. The first patterned distributed Bragg reflector 40 may be formed by using a deposition process, a lithography process, and an etching process.

The first sub-layers 401 and the second sub-layers 402 are alternately stacked on a surface of the counter substrate 20, for example, alternately stacked on a lower surface of the counter substrate 20 shown in FIG. 2, where a first sub-layer 401 contacts the counter substrate 20. In some embodiments, the thickness of the first sub-layer 401 contacting the counter substrate 20 is greater than the thickness of the second sub-layers 402 and the thickness of another first sub-layers 401 respectively.

With continued reference to FIG. 1, in order to simplify the expression of the figure, FIG. 1 merely depicts two color conversion layers 30. Since these color conversion layers 30 are not identical to each other, and in order to describe the characteristics of these color conversion layers 30 explicitly, these color conversion layers 30 here are distinguished as first color conversion layers 301 and second color conversion layers 302 (as shown in FIG. 1). That is, these color conversion layers 30 include multiple first color conversion layers 301 and multiple second color conversion layers 302.

In addition, other first color conversion layers 301 and second color conversion layers 302 may also be included where not shown on the page of the figure. As shown in FIG. 1, the color conversion layers 30 include multiple first color conversion layers 301 and multiple second color conversion layers 302, wherein the first color conversion layers 301 and the second color conversion layers 302 are used to convert the light emitted by the light-emitting substrate 10 into first colored light and second colored light, respectively, where the color of the first colored light is different from the color of the second colored light.

Since the light emitted by the light-emitting substrate 10 has a different color from those of both the first colored light and the second colored light, by using the first patterned distributed Bragg reflector 40, the first colored light and the second colored light may be transmitted, but the leaked light that is not converted by the color conversion layers 30 may be reflected back into the color conversion layers 30 to improve the light conversion efficiency. In some embodiments, the transmittance of the first patterned distributed Bragg reflector 40 for the first colored light is greater than that for the second colored light. In some embodiments, the first colored light is red, and the second colored light is green. Through the above structural design, the patterned distributed Bragg reflector may have a higher transmittance for the colored light with a lower conversion efficiency, with using the same stack material and thickness.

With continued reference to FIG. 1, the light-emitting substrate 10 includes a first substrate 100, a driving circuit layer 110, multiple light-emitting elements 120, a black spacer layer 130 and a filling layer 140. The display device 1 also includes an encapsulation layer 50 located on the filling layer 140. The driving circuit layer 110 is located on the first substrate 100. The multiple light-emitting elements 120 are located on the driving circuit layer 110 and electrically connected to the driving circuit layer 110, and arranged in the first direction D1. The black spacer layer 130 is disposed on the driving circuit layer 110, and disposed alternately with the light-emitting elements 120 in the first direction D1. The filling layer 140 and the encapsulation layer 50 are disposed on the light-emitting elements 120 and the black spacer layer 130.

In some embodiments, the material of the first substrate 100 may be a glass substrate or a transparent polymer material substrate. The aforementioned transparent polymer material is, for example, made of polyethylene terephthalate (PET) or polyimide (PI). The driving circuit layer 110 may include elements or lines required for the display device 1, such as drive elements, switch elements, storage capacitors, power lines, driving signal lines, timing signal lines, current compensation lines, and detection signal lines. For example, the driving circuit layer 110 may be formed by using a thin film deposition process, a lithography process, and an etching process.

The light-emitting elements 120 may be light-emitting diodes (LEDs), such as sub-millimeter-light-emitting diodes (mini LEDs) or micro-light-emitting diodes (micro LEDs, μLEDs). The thickness of the micro-light-emitting diode is below 10 micrometers, for example 6 micrometers. Sub-millimeter-light-emitting diodes can be divided into two types: one contains encapsulant and the other does not contain encapsulant. The thickness of sub-millimeter-light-emitting diode containing encapsulant can be less than 800 micrometers, and the thickness of sub-millimeter-light-emitting diode without encapsulant can be less than 100 micrometers. In addition, the light-emitting elements 120 can also be large-sized regular LEDs other than sub-millimeter-light-emitting diodes and micro-light-emitting diodes, so the light-emitting elements 120 are not limited to being sub-millimeter-light-emitting diodes or micro-light-emitting diodes of smaller size.

The material of the black spacer layer 130 may be ink or photoresist. The material of the filling layer 140 and the encapsulation layer 50 may be an organic insulating material, an inorganic insulating material, or a combination thereof. For example, the organic insulating material may be polyimide, polyamic acid (PAA), polyamide (PA), polyvinyl alcohol (PVA), polyvinyl cinnamate (PVCi), polymethyl methacrylate (PMMA), other suitable photoresist materials, or a combination thereof. The inorganic insulating material may be silicon oxide, silicon nitride, silicon oxynitride, siloxane or other suitable insulating materials. In some embodiments, the black spacer layer 130, the filling layer 140 and the encapsulation layer 50 may be formed by using an ink-jetting process, a printing process or a photolithography process.

With continued reference to FIG. 1, the display device 1 also includes multiple scattering layers 31 and an isolation layer 60, both of which are disposed between the light-emitting substrate 10 and the counter substrate 20. In order to simplify the expression of the figure, FIG. 1 merely depicts one scattering layer 31 as a representative representation. However, it can be understood that other scattering layers 31 may also be included where not shown on the page of the figure. Specifically, the first color conversion layers 301, the second color conversion layers 302 and the scattering layers 31 are arranged in sequence in the first direction D1, and the isolation layer 60 is disposed alternately with the first color conversion layers 301, the second color conversion layers 302 and the scattering layers 31 in the first direction D1.

In some embodiments, the color conversion layers 30 may include phosphors, quantum dots (QDs), or wavelength conversion materials of similar properties, such as silicates, silicon nitrides, sulfides, quantum dots, garnets or other suitable materials, or a combination of the above materials, such that the light emitted by the light-emitting element 120 is converted into a colored light with a desired color. The color conversion layers 30 may be formed by using a spin coating process or a spray coating process.

In this embodiment, the first color conversion layer 301 and the second color conversion layer 302 may be quantum dot color conversion layers, where the first color conversion layer 301 and the second color conversion layer 302 may respectively include ink and quantum dots of different sizes. In this way, the quantum dots of the first color conversion layer 301 may be excited by the light energy from the light-emitting element 120 to release the first colored light, and the quantum dots of the second color conversion layer 302 may be excited by the light energy from the light-emitting element 120 to release the second colored light. For example, the light emitted by the light-emitting element 120 is blue light, the first colored light released by the first color conversion layer 301 is red light, and the second colored light released by the second color conversion layer 302 is green light.

In some embodiments, the scattering layer 31 may include a light scattering agent and resin or other suitable materials, wherein the light scattering agent may contain multiple micro-particles capable of scattering light, and these micro-particles are distributed in the resin. In this way, the light emitted by the light-emitting element 120 may be scattered or diffused by the scattering layer 31, thereby increasing the light quantity of the visible light. The material of the isolation layer 60 may include acrylic resin, silicone, photoresist or other suitable materials, or a combination of the above materials. The scattering layer 31 and the isolation layer 60 may be formed by using a coating process, an ink-jetting process, a printing process or a photolithography process.

With continued reference to FIG. 1, the counter substrate 20 includes a second substrate 200, multiple color filter layers 210, multiple light-transmitting layers 220 and a black matrix layer 230. The color filter layers 210, the light-transmitting layers 220 and the black matrix layer 230 are located on the second substrate 200. The black matrix layer 230 is disposed alternately with the color filter layers 210 and the multiple light-transmitting layers 220 in the first direction D1. In order to simplify the expression of the figure, FIG. 1 merely depicts one first color filter layer 211, one second color filter layer 212 and one light-transmitting layer 220 as representative representations. However, it can be understood that other first color filter layers 211, second color filter layers 212 and light-transmitting layers 220 may also be included where not shown on the page of the figure.

As shown in FIG. 1, the color filter layers 210 include multiple first color filter layers 211 and multiple second color filter layers 212, where the first color filter layers 211 are different from the second color filter layers 212. The first color filter layers 211, the second color filter layers 212 and the light-transmitting layers 220 are arranged in the first direction D1. The first color filter layer 211 is disposed corresponding to (i.e., in alignment with) the first patterned distributed Bragg reflector 40 and the first color conversion layer 301. The second color filter layer 212 is disposed correspond to (i.e., in alignment with) the first patterned distributed Bragg reflector 40 and the second color conversion layer 302. The light-transmitting layer 220 is disposed corresponding to (i.e., in alignment with) the scattering layer 31.

Specifically, one first patterned distributed Bragg reflectors 40 is located between the first color filter layer 211 and the first color conversion layer 301, and another first patterned distributed Bragg reflector 40 is located between the second color filter layer 212 and the second color conversion layer 302. That is, the first patterned distributed Bragg reflector 40 is disposed between the first color filter layer 211 and first color conversion layer 301 adjacent to the first color filter layer 211, and is disposed between the second color filter layer 212 and the second color conversion layer 302 adjacent to the second color filter layer 212, and there is no first patterned distributed Bragg reflector 40 disposed between the light-transmitting layer 220 and the scattering layer 31.

In some embodiments, the material of the second substrate 200 may be a glass substrate or a transparent polymer material substrate. The aforementioned transparent polymer material is, for example, made of polyethylene terephthalate or polyimide. The color filter layer 210, the light-transmitting layer 220 and the black matrix layer 230 may respectively include color photoresist, transparent photoresist, black photoresist or other suitable materials, or a combination of the above materials. The first color filter layer 211 and the second color filter layer 212 may respectively render different colors, such that the display device 1 can emit different colored lights.

For example, the first color filter layer 211 and the second color filter layer 212 are a red filter layer and a green filter layer, respectively. The color filter layer 210, the light-transmitting layer 220 and the black matrix layer 230 may be formed by using a coating process, an ink-jetting process, a printing process or a photolithography process.

Figure 3:
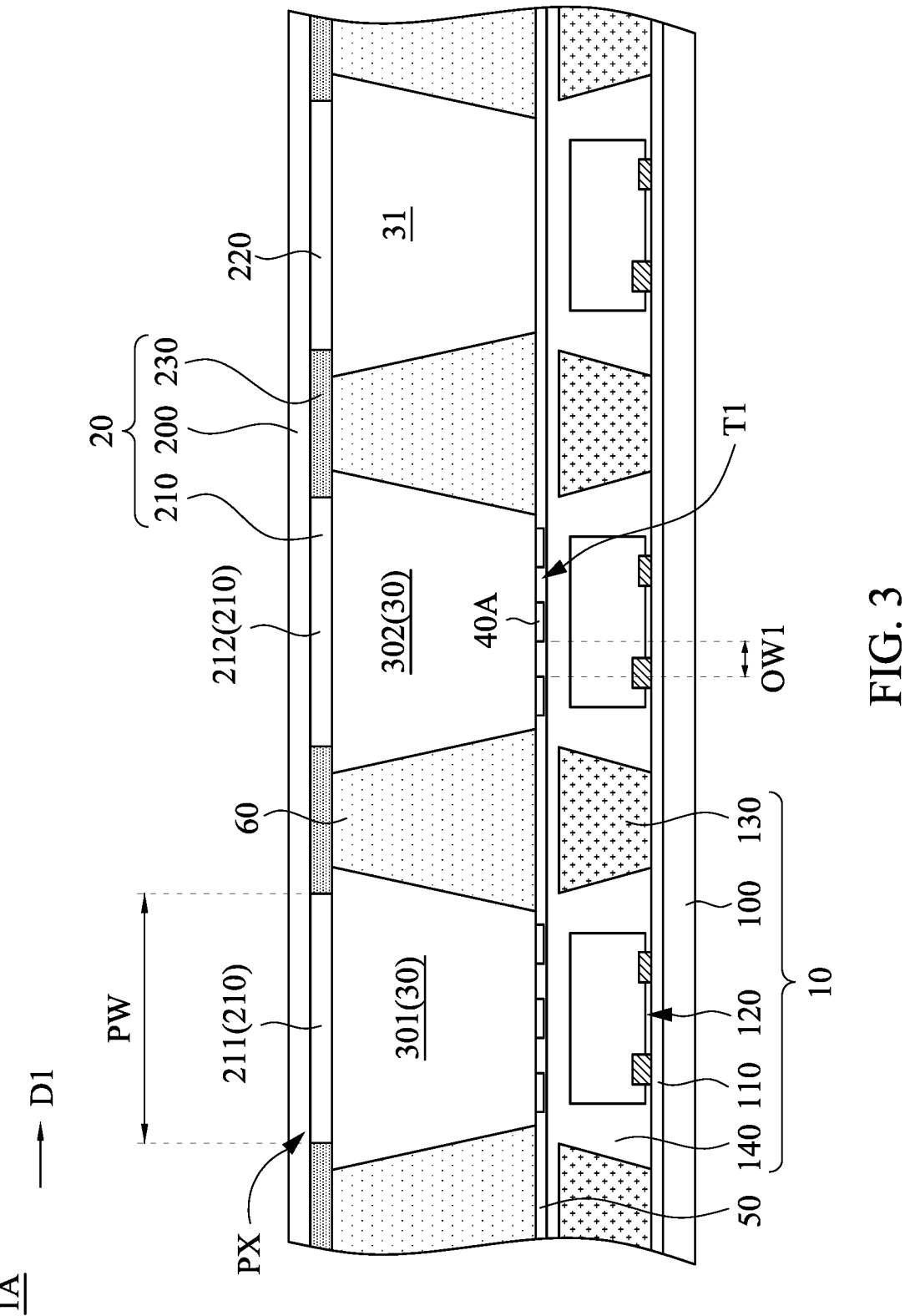
FIG. 3 is a partial cross-sectional schematic diagram of a display device according to at least another embodiment of the present disclosure.

FIG. 3 is a partial cross-sectional schematic diagram of a display device according to at least another embodiment of the present disclosure. Referring to FIG. 3, most of the component structures, materials, processes, and relative positional relationships of the embodiment of FIG. 3 are the same as those of the embodiment of FIG. 1, so they will not be described again here. The difference between the two embodiments is that a first patterned distributed Bragg reflector 40A of a display device 1A of FIG. 3 is located between the color conversion layers 30 and the light-emitting substrate 10. In some embodiments, the first patterned distributed Bragg reflector 40A directly contacts the encapsulation layer 50. In some embodiments, the encapsulation layer 50 is further disposed in the first through-holes T1 of the first patterned distributed Bragg reflector 40A. That is, the encapsulation layer 50 is filled into the first through-holes T1.

Figure 4:
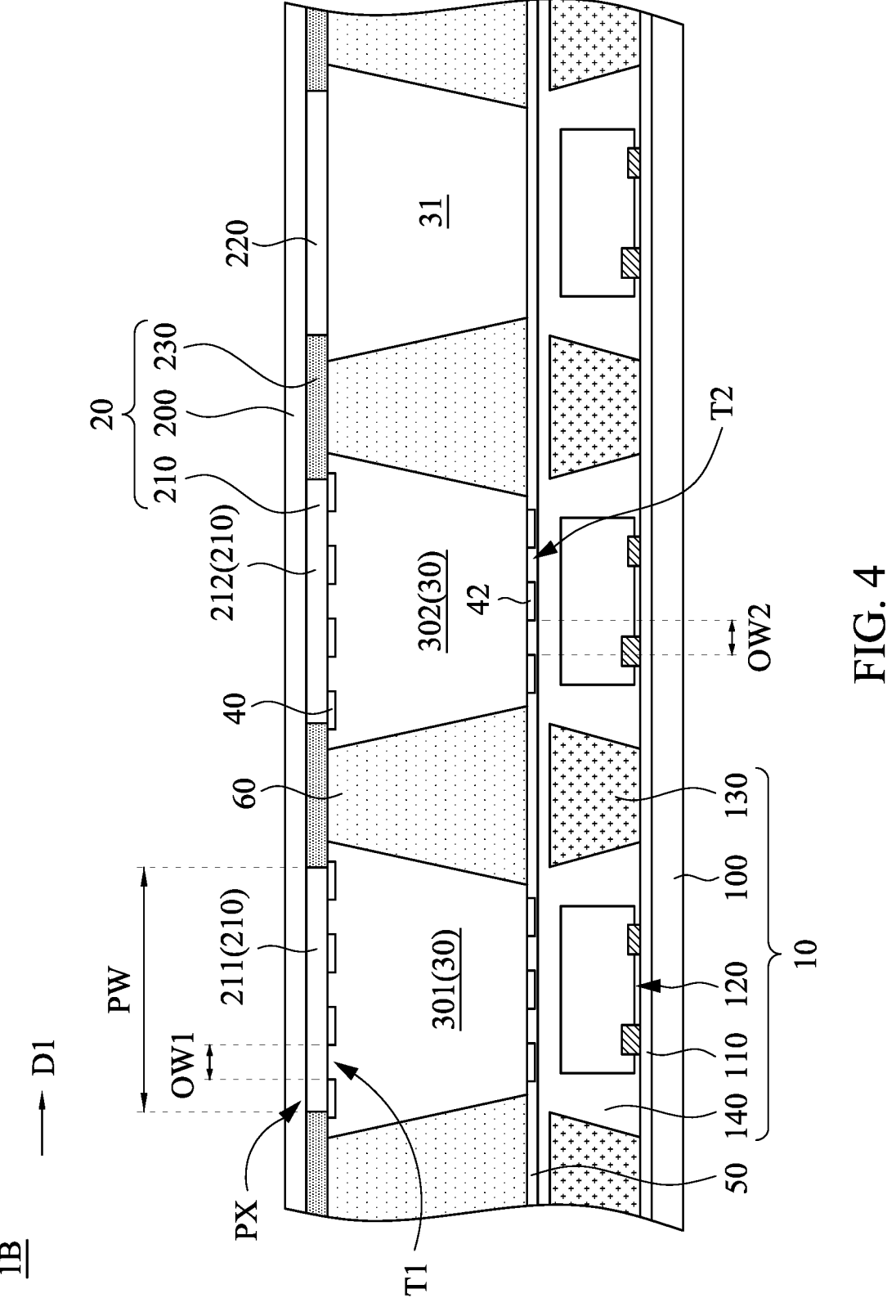
FIG. 4 is a partial cross-sectional schematic diagram of a display device according to at least another embodiment of the present disclosure.

FIG. 4 is a partial cross-sectional schematic diagram of a display device according to at least another embodiment of the present disclosure. Referring to FIG. 4, most of the component structures, materials, processes, and relative positional relationships of the embodiment of FIG. 4 are the same as those of the embodiment of FIG. 1, so they will not be described again here. The difference between the two embodiments is that in addition to the first patterned distributed Bragg reflector 40 located between the color conversion layers 30 and the counter substrate 20, the display device 1B of FIG. 4 includes a second patterned distributed Bragg reflector 42 located between the color conversion layers 30 and the light-emitting substrate 10.

As shown in FIG. 4, the second patterned distributed Bragg reflector 42 has multiple second through-holes T2. Each of the second through-holes T2 has a second opening width OW2 in the first direction D1, and the second opening width OW2 is greater than or equal to 1 μm, and less than the sub-pixel width PW. In some embodiments, the second opening width OW2 is greater than the first opening width OW1. In some embodiments, the second patterned distributed Bragg reflector 42 has an aperture ratio greater than that of the first patterned distributed Bragg reflector 40. Specifically, in one sub-pixel area PX, the ratio of the total area of the second through-holes T2 of the second patterned distributed Bragg reflector 42 to the total area of the one sub-pixel area PX is greater than the ratio of the total area of the first through-holes T1 of the first patterned distributed Bragg reflector 40 to the total area of one sub-pixel area PX.

Since the light emitted by the light-emitting substrate 10 has a different color from that of the colored light converted into by the color conversion layers 30, in addition to providing the first patterned distributed Bragg reflector 40, by further using the second patterned distributed Bragg reflector 42, the leaked light that is not converted by the color conversion layers 30 may be repeatedly reflected back into the color conversion layers 30. Therefore, the light conversion efficiency can be improved. Moreover, the aperture ratio of the second patterned distributed Bragg reflector 42 is greater than the aperture ratio of the first patterned distributed Bragg reflector 40, such that the light emitted by the light-emitting substrate 10 can smoothly enter the color conversion layers 30 for light conversion. Therefore, through the design of the above structure, the reuse rate of light can be increased to improve the light conversion efficiency, thereby reducing the thickness of the color conversion layer and the isolation layer, thus reducing material costs and process difficulty.

Figure 5:
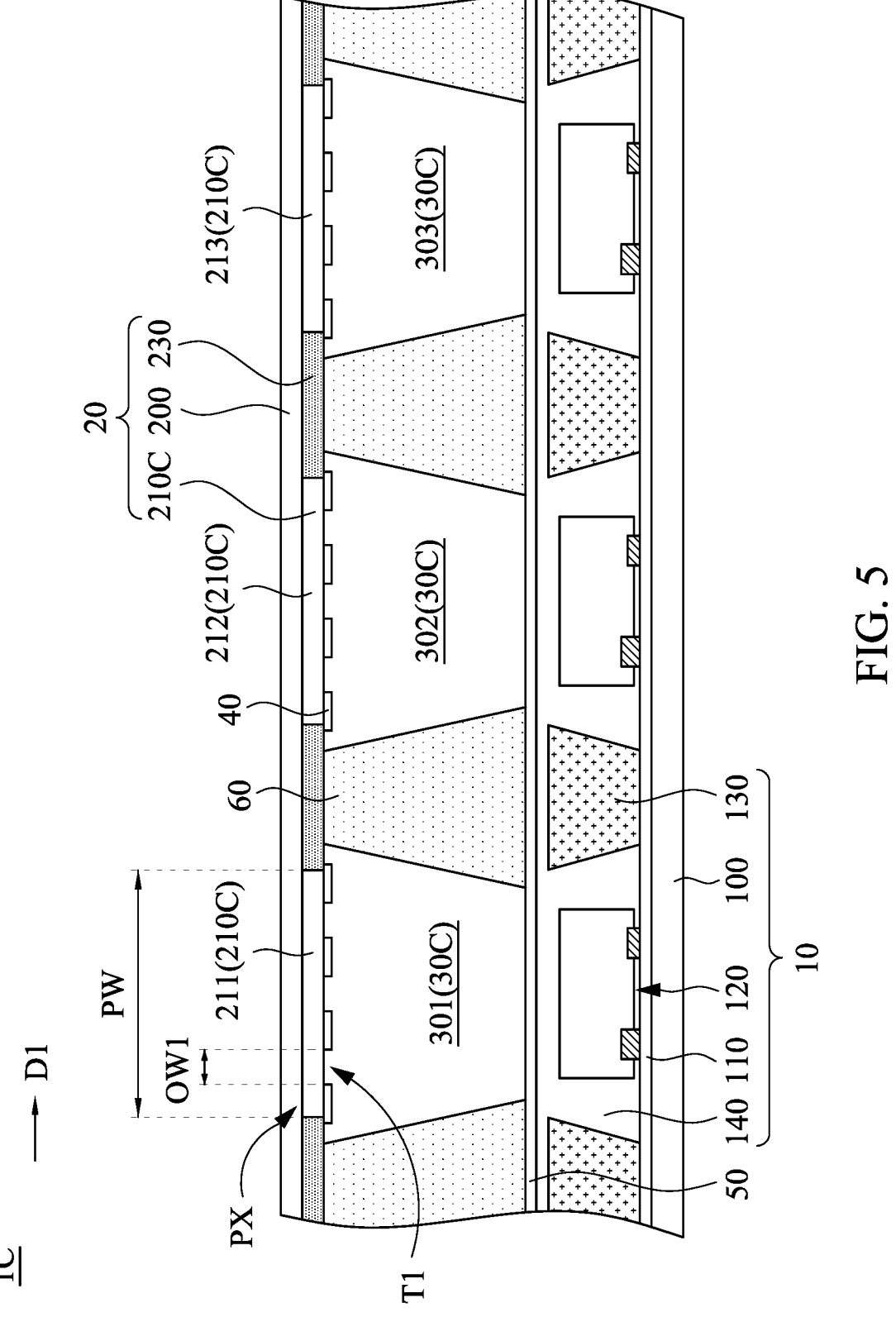
FIG. 5 is a partial cross-sectional schematic diagram of a display device according to at least another embodiment of the present disclosure.
Figure 6:
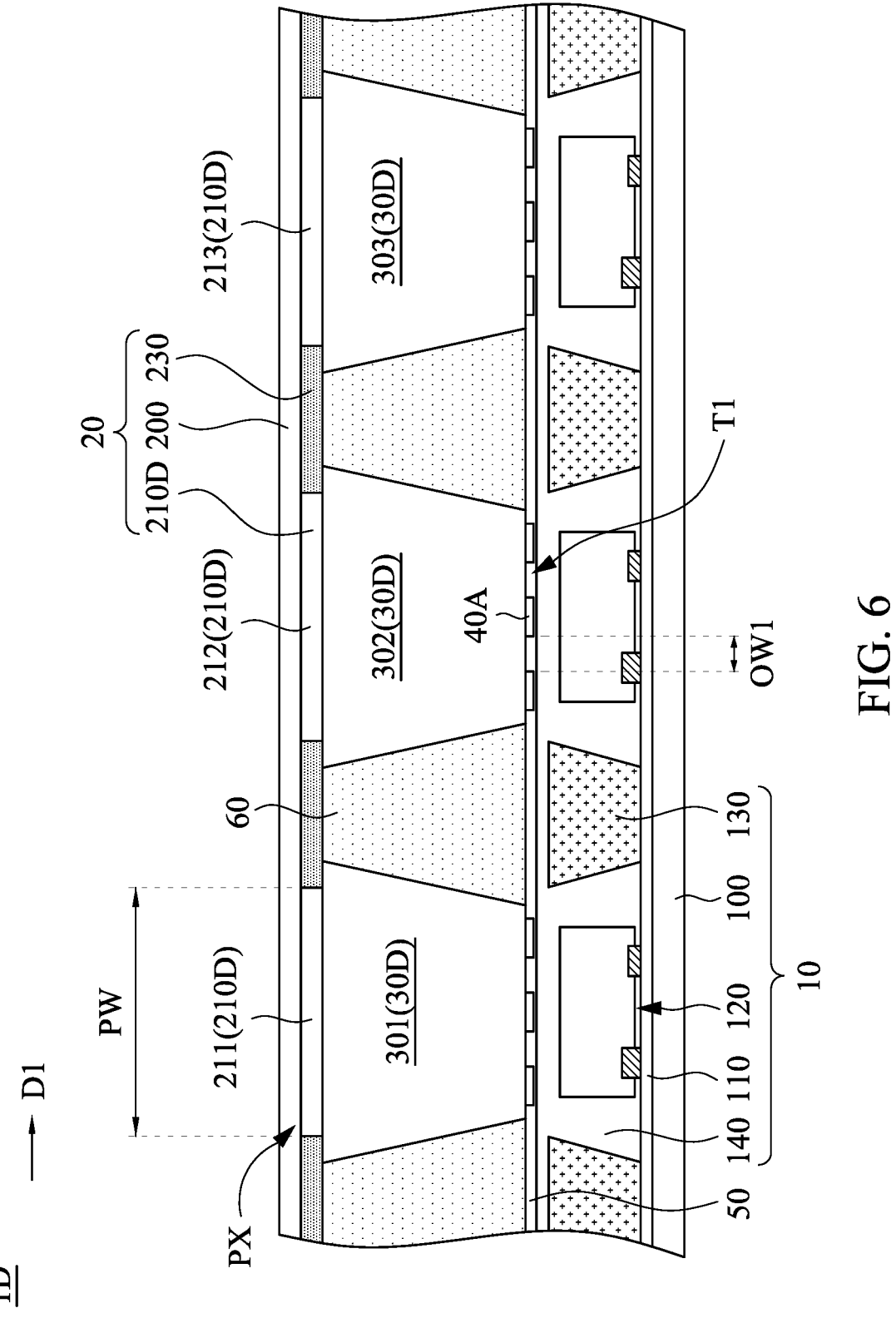
FIG. 6 is a partial cross-sectional schematic diagram of a display device according to at least another embodiment of the present disclosure.
Figure 7:
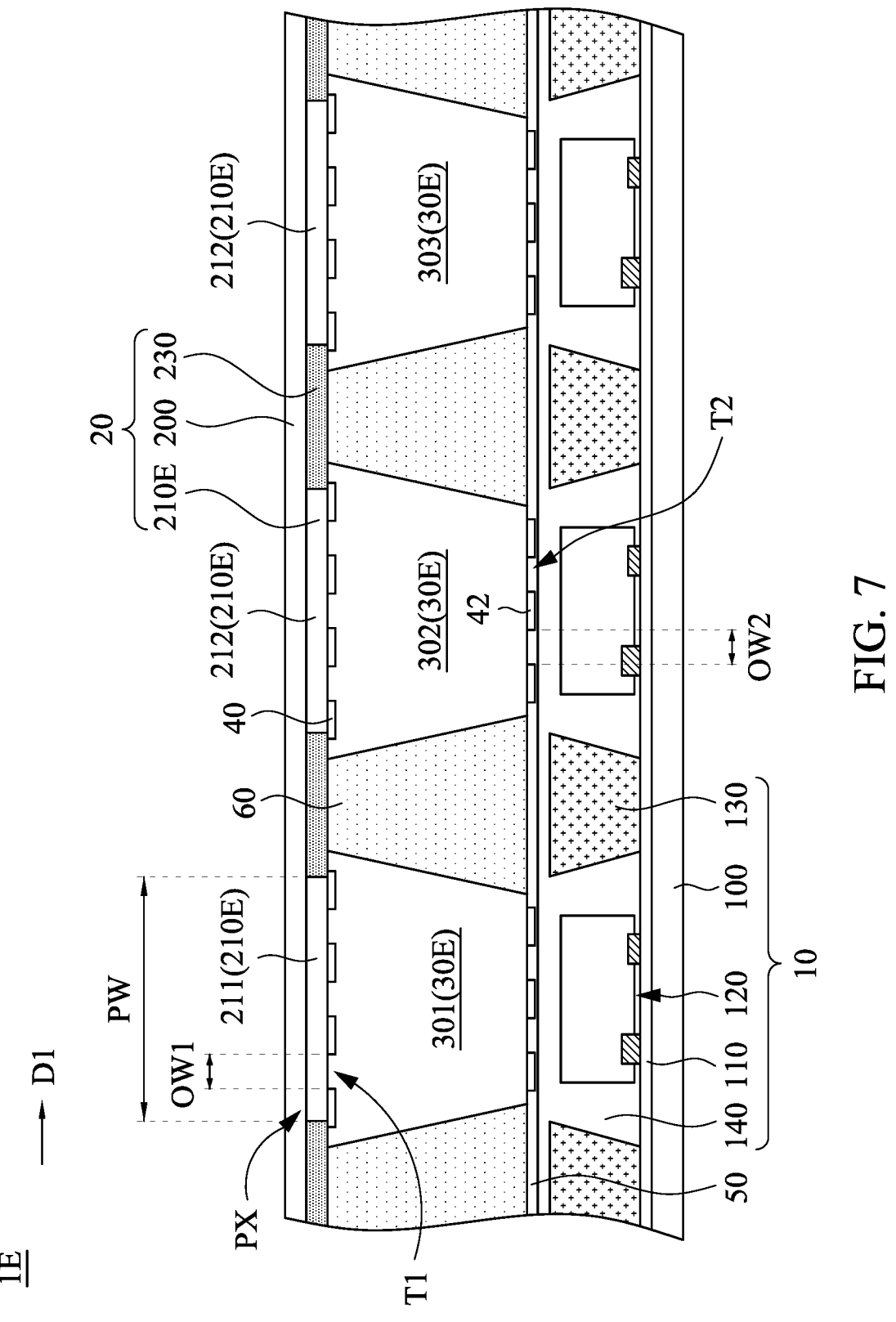
FIG. 7 is a partial cross-sectional schematic diagram of a display device according to at least another embodiment of the present disclosure.

FIGS. 5, 6, and 7 are partial cross-sectional schematics of a display device according to at least another embodiment of the present disclosure, respectively. Most of the component structures, materials, processes, and relative positional relationships of the embodiments of FIGS. 5, 6, and 7 are the same as those of the embodiments of FIGS. 1, 3, and 4, so the same technical features will not be described again here. The difference between the embodiments of FIGS. 5, 6, and 7 and the embodiments of FIGS. 1, 3, and 4 is color filter layers 210C, 210D, and 210E and color conversion layers 300, 30D, and 30E of display devices 1C, 1D, and 1E of FIGS. 5, 6, and 7. In some embodiments, the display device 1C, 1D, and 1E are not provided with the light-transmitting layers 220 and the scattering layers 31. In order to simplify the expression of the figures, FIGS. 5, 6 and 7 merely depict one third color filter layer 213 and one third color conversion layer 303 as representative representations, respectively. However, it can be understood that other third color filter layers 213 and third color conversion layers 303 may also be included where not shown on the page of the figures.

Specifically, in addition to the first color filter layers 211 and the second color filter layers 212, the color filter layers 210C, 210D, and 210E include multiple third color filter layers 213, respectively. In addition to the first color conversion layers 301 and the second color conversion layers 302, the color conversion layers 300, 30D, and 30E include multiple third color conversion layers 303, respectively. The first color filter layer 211, the second color filter layer 212, and the third color filter layer 213 may respectively render different colors, such that the display device 1 can emit different colored lights. The first color conversion layer 301, the second color conversion layer 302 and the third color conversion layer 303 are used to convert the light emitted by the light-emitting substrate 10 into first colored light, second colored light, and third colored light, respectively. The colors of the first colored light, the second colored light and the third colored light are different from each other.

In some embodiments, the colors of the first colored light, the second colored light and the third colored light are red, green and yellow, respectively. In some embodiments, in addition to the first color filter layer 211, the second color filter layer 212 and the third color filter layer 213, the first color conversion layer 301, the second color conversion layer 302 and the third color conversion layer 303, the display devices 1C, 1D, and 1E also can include a light-transmitting layer 220 and a scattering layer 31.

As shown in FIG. 5, in addition to being located between the first color filter layer 211 and the first color conversion layer 301, and being located between the second color filter layer 212 and the second color conversion layer 302, the first patterned distributed Bragg reflector 40 is located between the third color filter layer 213 and the third color conversion layer 303. That is, the first patterned distributed Bragg reflector 40 is disposed between the first color filter layer 211 and the first color conversion layers 301 adjacent to the first color filter layer 211, is disposed between the second color filter layer 212 and the second color conversion layer 302 adjacent to the second color filter layer 212, and is disposed between the third color filter layer 213 and the third color conversion layer 303 adjacent to the third color filter layer 213. In other words, the first patterned distributed Bragg reflector 40 is respectively located between the counter substrate 20 and the first color conversion layer 301, the second color conversion layer 302, and the third color conversion layer 303.

As shown in FIG. 6, in addition to being located between the first color conversion layer 301 and the light-emitting substrate 10, and being located between the second color conversion layer 302 and the light-emitting substrate 10, the first patterned distributed Bragg reflector 40A is located between the third color conversion layer 303 and the light-emitting substrate 10.

As shown in FIG. 7, in addition to being located between the first color filter layer 211 and the first color conversion layer 301, and being located between the second color filter layer 212 and the second color conversion layer 302, the first patterned distributed Bragg reflector 40 is located between the third color filter layer 213 and the third color conversion layer 303. That is, the first patterned distributed Bragg reflector 40 is disposed between the first color filter layer 211 and the first color conversion layers 301 adjacent to the first color filter layer 211, is disposed between the second color filter layer 212 and the second color conversion layer 302 adjacent to the second color filter layer 212, and is disposed between the third color filter layer 213 and the third color conversion layer 303 adjacent to the third color filter layer 213.

In other words, the first patterned distributed Bragg reflector 40 is respectively located between the counter substrate 20 and the first color conversion layer 301, the second color conversion layer 302, and the third color conversion layer 303. In addition to being located between the first color conversion layer 301 and the light-emitting substrate 10, and being located between the second color conversion layer 302 and the light-emitting substrate 10, the second patterned distributed Bragg reflector 42 is located between the third color conversion layer 303 and the light-emitting substrate 10.

Since the light emitted by the light-emitting substrate 10 has a different color (i.e., a different wavelength) from those of the first colored light, the second colored light and the third colored light, by using the first patterned distributed Bragg reflectors 40 and 40A, the first colored light, the second colored light and the third colored light that have been converted into by the first color conversion layer 301, the second color conversion layer 302 and the third color conversion layer 303 may be transmitted, respectively, but the leaked light that is not converted by the first color conversion layer 301, the second color conversion layer 302 and the third color conversion layer 303 may be reflected back into the first color conversion layer 301, the second color conversion layer 302 and the third color conversion layer 303, respectively, to improve the light conversion efficiency. Therefore, through the design of the above structures, the light conversion efficiency and the color purity of the color of the outgoing light can be improved.

In addition to providing the first patterned distributed Bragg reflector 40, by using the second patterned distributed Bragg reflector 42, the leaked light that is not converted by the first color conversion layer 301, the second color conversion layer 302 and the third color conversion layer 303 may be repeatedly reflected back into the first color conversion layer 301, the second color conversion layer 302 and the third color conversion layer 303, respectively. Therefore, the light conversion efficiency can be improved. Moreover, the aperture ratio of the second patterned distributed Bragg reflector 42 is greater than the aperture ratio of the first patterned distributed Bragg reflector 40, such that the light emitted by the light-emitting substrate 10 can smoothly enter the first color conversion layer 301, the second color conversion layer 302 and the third color conversion layer 303, respectively for light conversion. Through the design of the above structure, the reuse rate of light can be increased to improve the light conversion efficiency, thereby reducing the thickness of the color conversion layer and the isolation layer, thus reducing material costs and process difficulty.

In summary, in the above display device according to the at least one embodiment of the present disclosure, by providing the patterned distributed Bragg reflector, the colored light that has been converted into by the color conversion layers can be transmitted, but the leaked light that is not converted by the color conversion layers is reflected back into the color conversion layers to improve the light conversion efficiency. In addition, the through-holes of the patterned distributed Bragg reflector may increase the transmittance of the colored light that has been converted into by the color conversion layers. And, since the opening width of the through-hole is greater than or equal to 1 μm, the through-hole is difficult to generate diffraction sufficient to affect the image quality, thereby maintaining or improving the image quality. Therefore, the light conversion efficiency of the display device and the color purity of the color of the outgoing light can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A display device, comprising:
a light-emitting substrate;
a counter substrate, disposed opposite to the light-emitting substrate, and having multiple sub-pixel areas, each of the sub-pixel areas having a sub-pixel width in a first direction;
multiple color conversion layers, disposed between the light-emitting substrate and the counter substrate;
a first patterned distributed Bragg reflector, disposed on one side of the color conversion layers and having multiple first through-holes, wherein each of the first through-holes has a first opening width in the first direction, and the first opening width is greater than or equal to 1 μm, and less than the sub-pixel width, wherein the first patterned distributed Bragg reflector is located between the color conversion layers and the counter substrate; and a second patterned distributed Bragg reflector, located between the color conversion layers and the light-emitting substrate and having multiple second through-holes.

2. The display device according to claim 1, wherein the color conversion layers are filled into the first through-holes.

3. The display device according to claim 1, wherein each of the second through-holes has a second opening width in the first direction, the second opening width is greater than or equal to 1 μm, and less than the sub-pixel width.

4. The display device according to claim 3, wherein the second opening width is greater than the first opening width.

5. The display device according to claim 1, wherein the second patterned distributed Bragg reflector has an aperture ratio greater than that of the first patterned distributed Bragg reflector.

6. The display device according to claim 1, further comprising an encapsulation layer located between the color conversion layers and the light-emitting substrate, wherein the encapsulation layer directly contacts the second patterned distributed Bragg reflector.

7. The display device according to claim 1, further comprising an encapsulation layer located between the color conversion layers and the light-emitting substrate, wherein the encapsulation layer is filled into the second through-holes.

8. The display device according to claim 1, wherein the first patterned distributed Bragg reflector comprises multiple first sub-layers and multiple second sub-layers that are stacked alternately, wherein a thickness of one of the first sub-layers directly contacting the counter substrate is greater than a thickness of each of the second sub-layers and a thickness of each of another of the first sub-layers respectively.

* * * * *